(12) United States Patent
Kwon et al.

(10) Patent No.: US 6,444,538 B2
(45) Date of Patent: Sep. 3, 2002

(54) METHOD FOR MANUFACTURING A SEMICONDUCTOR MEMORY DEVICE USING HEMISPHERICAL GRAIN SILICON

(75) Inventors: Se-Han Kwon; Jang-Yup Kim, both of Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/735,626

(22) Filed: Dec. 14, 2000

(30) Foreign Application Priority Data

Dec. 30, 1999 (KR) .............................. 99-66676

(51) Int. Cl.[7] .............................................. H01L 21/20
(52) U.S. Cl. ...................... 438/396; 438/398; 438/239; 438/241
(58) Field of Search ................................ 438/396, 239, 438/255, 257, 240, 241, 250, 260, 393, 398, 964

(56) References Cited

U.S. PATENT DOCUMENTS 3,639,121 A * 2/1972 York .............................. 96/1.5
3,855,507 A * 12/1974 Hoyler ......................... 317/258
5,389,568 A * 2/1995 Yun .............................. 437/60
6,187,631 B1 * 2/2001 Harshfield ................... 438/255
6,211,035 B1 * 4/2001 Moise et al. ................. 438/396

OTHER PUBLICATIONS

Wolf,"Silicon Processing For VLSI", vol. 1,pp. 559–575.*

* cited by examiner

Primary Examiner—Keith Christianson
Assistant Examiner—Yennhu B. Huynh
(74) Attorney, Agent, or Firm—Finnegan, Henderson, Farabow, Garrett & Dunner, L.L.P.

(57) ABSTRACT

A semiconductor device for manufacturing a semiconductor memory cell includes the steps of: a) preparing an active matrix provided with at least one transistor, a plurality of conductive plugs electrically connected to the transistors and an insulating layer formed around the conductive plugs; b) forming a supporting layer, made of carbon, on top of the active matrix and patterned into a predetermined configuration, thereby obtaining a patterned supporting layer; c) forming bottom electrodes on the patterned supporting layer; and d) removing the patterned supporting layer.

9 Claims, 4 Drawing Sheets

METHOD FOR MANUFACTURING A SEMICONDUCTOR MEMORY DEVICE USING HEMISPHERICAL GRAIN SILICON

FIELD OF THE INVENTION

The present invention relates to a semiconductor device; and, more particularly, to a method for manufacturing a semiconductor memory device incorporating therein textured electrodes for implementing a high-density storage capacitor.

DESCRIPTION OF THE PRIOR ART

As is well known, a dynamic random access memory (DRAM) with at least one memory cell comprised of a transistor and a capacitor has a higher degree of integration mainly by downsizing through micronization. However, there is still a demand for downsizing the area of the memory cell.

To meet the demand, therefore, there have been proposed several methods, such as a trench type or a stack type capacitor, which is arranged three-dimensionally in a memory device to reduce the cell area available to the capacitor. However, the process of manufacturing three-dimensionally arranged capacitor is a long and tedious one and consequently involves high manufacturing cost. Therefore, there is a strong demand for a new memory device that can reduce the cell area with securing a requisite volume of information without requiring complex manufacturing steps.

In attempt to meet the demand, there have been proposed a high-density dynamic random access memory (DRAM) which incorporates bottom electrodes having textured surface morphology by forming hemispherical grain (HSG) thereon.

One of the major shortcomings of the above-described high-density DRAM is that it requires processes for forming a nitride layer and a buffer oxide layer as an etching stop layer during the formation of the bottom electrodes.

SUMMARY OF THE INVENTION

It is, therefore, an object of the present invention to provide a method for manufacturing a semiconductor device capable of simplifying the manufacturing steps thereof by incorporating therein a carbon layer as a supporting layer.

In accordance with one aspect of the present invention, there is provided a method for manufacturing a semiconductor device for use in a memory cell, the method comprising the steps of: a) preparing an active matrix provided with at least one transistor, a plurality of conductive plugs electrically connected to the transistors and an insulating layer formed around the conductive plugs; b) forming a supporting layer, made of carbon, on top of the active matrix and patterned into a predetermined configuration, thereby obtaining a patterned supporting layer; c) forming bottom electrodes on the patterned supporting layer; d) removing the patterned supporting layer; e) forming hemispherical grains (HSGs) on surfaces of the bottom electrodes; f) forming capacitor dielectric films on top of the bottom electrodes; and g) forming top electrodes on top of the capacitor dielectric films, thereby obtaining a capacitor.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
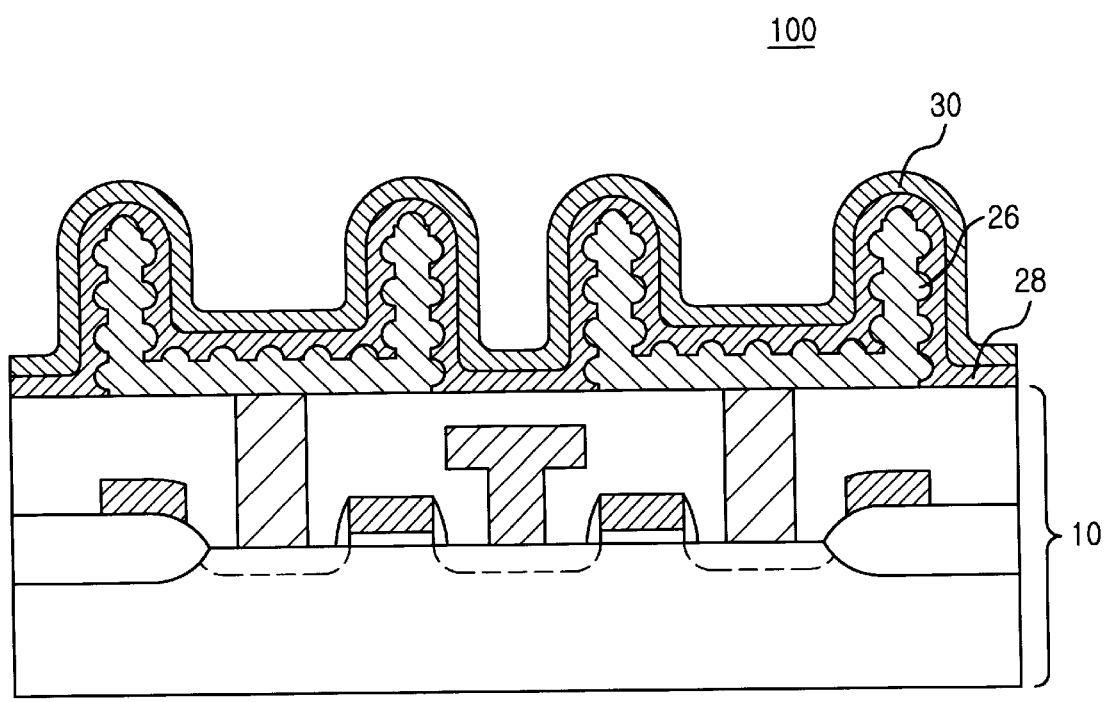
FIG. 1 is a cross sectional view setting forth a semiconductor device in accordance with the present invention.

There are provided in FIGS. 1 and 2A to 2F a cross sectional view of a semiconductor device 100 for use in a memory cell and cross sectional views setting forth a method for the manufacture thereof in accordance with preferred embodiments of the present invention. It should be noted that like parts appearing in FIGS. 1 and 2A to 2F are represented by like reference numerals.

In FIG. 1, there is provided a cross sectional view of the inventive semiconductor device 100 comprising an active matrix 10, bottom electrodes 25 provided with hemispherical grains (HSGs) 26, a capacitor dielectric layer 28 and a top electrode layer 30. The active matrix 10 includes a silicon substrate 2, transistors formed on top of the silicon substrate 2, an isolation region 4 for isolating the transistors, poly plugs 16, a bit line 18 and word lines 20. Each of the transistors has diffusion regions 6, a gate oxide 8, a gate line 12 and a side wall 14.

In the semiconductor device 100, the bit line 18 is electrically connected to one of the diffusion regions 6 to apply an electric potential. Each of the bottom electrodes 26 is electrically connected to the other diffusion regions 6 through the poly plugs 16. Although the bit line 18 actually extends in right and left directions bypassing the poly plugs 16, the drawing does not show these parts of the bit line 18. It is preferable that the bottom electrodes 25 are made of a material such as polysilicon, amorphous silicon (a-Si) or the like. And also, each of the bottom electrodes 26 has a textured surface to enlarge the electrode surface area without increasing the lateral dimensions thereof.

FIGS. 2A to 4F are schematic cross sectional views setting forth the method for manufacture of a semiconductor memory device 100 in accordance with the present invention.

Figure 2A:
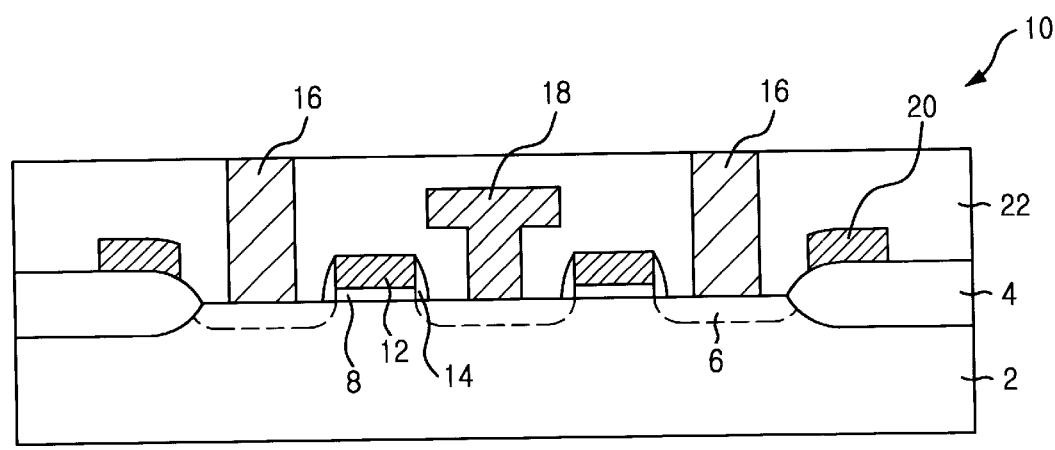
FIGS. 2A to 2F are schematic cross sectional views setting forth a method for the manufacture of the semiconductor memory device in accordance with the present invention.

The process for manufacturing the semiconductor device 100 begins with the preparation of an active matrix 10 including a silicon substrate 2, an isolation region 4, diffusion regions 6, gate oxides 8, gate lines 12, side walls 14, a bit line 18, poly plugs 16 and an insulating layer 22, as shown in FIG. 2A. The bit line 18 is electrically connected to one of the diffusion regions 6 to apply an electric potential. Each of the poly plugs 16 is electrically connected to the other diffusion regions 6, respectively. Although the bit line 18 actually extends in right and left directions bypassing the poly plugs 16, the drawing does not show these parts of the bit line 18. The insulating layer 22 is made of a material, e.g., boron-phosphor-silicate glass (BPSG).

Figure 2B:
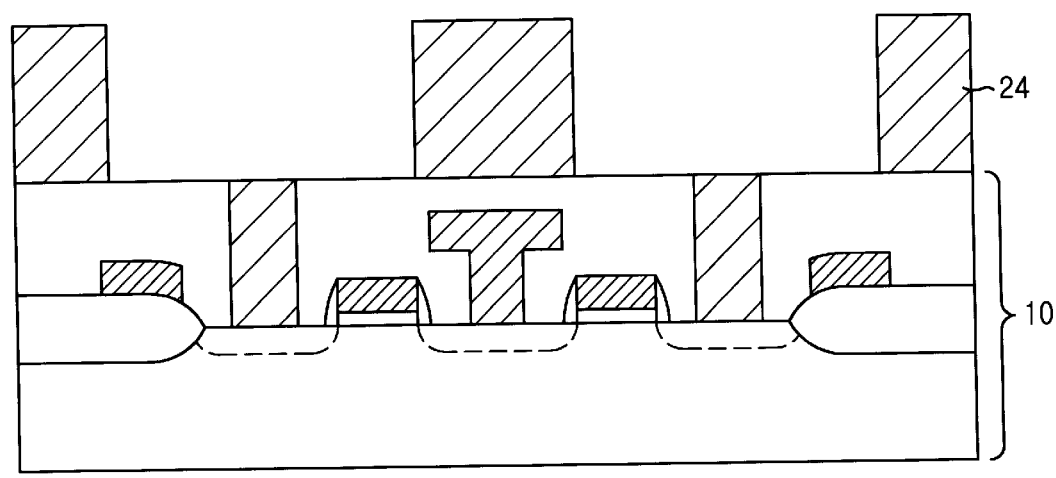

In an ensuing step, a supporting layer, e.g., made of carbon, is formed on top of the active matrix 10 by using a method such as a chemical vapor deposition (CVD) or a physical vapor deposition (PVD) and patterned into a predetermined configuration, thereby obtaining a patterned supporting layer 24, as shown in FIG. 2B. If the supporting layer is made of oxide and an etching stop layer is made of nitride, there is occurred a punch effect during the etching of the supporting layer due to its low etching ratio between the supporting layer and the etching stop layer. In the preferred embodiment, the present invention employs a carbon layer as a supporting layer to prevent the active matrix 10 from the attack during the etching of the supporting layer without forming an additional etching stop layer. This is achieved by utilizing an $O_2$ gas as an etchant gas.

Figure 2C:
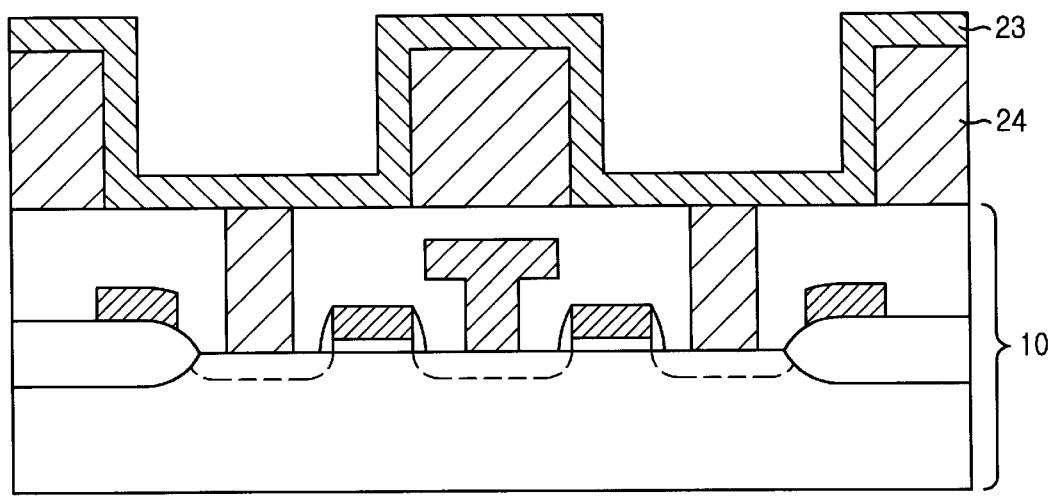

In a following step, a conductive layer 23 is formed on top of the patterned supporting layer 24 and the active matrix 10, as shown in FIG. 2C. Preferably, the conductive layer 25 is made of a material selected from a group consisting of amorphous silicon, poly silicon, $Ta_2O_5$ and TiN. In the preferred embodiment, the conductive layer 23 has a thickness ranging from approximately 400 Å to approximately 700 Å.

Figure 2D:
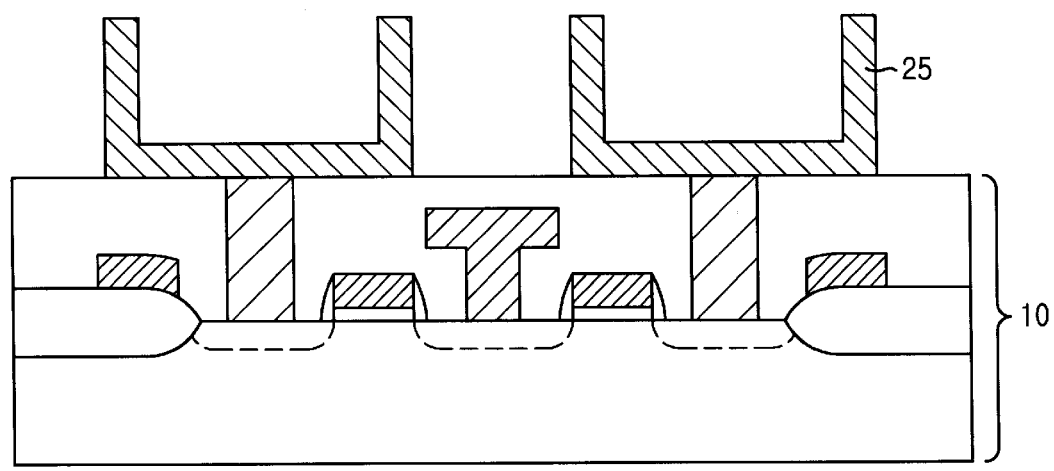

In the next step, a photoresist layer (not shown) is formed on the entire surface of the conductive layer 23. The photoresist layer has a thickness ranging from approximately 8,000 Å to approximately 15,500 Å. And then, the photoresist layer and the conductive layer 23 are planarized by using a method such as a chemical mechanical polishing (CMP) or the like until the patterned supporting layer 24 is exposed. Thereafter, the patterned supporting layer 24 are removed by using a dry etching, thereby obtaining bottom electrode structures 25, as shown in FIG. 2D. In this case, the dry etching utilizes an $O_2$ gas as a reaction gas. It is possible that the patterned supporting layer 24 can be removed by using an etch-back process.

Figure 2E:
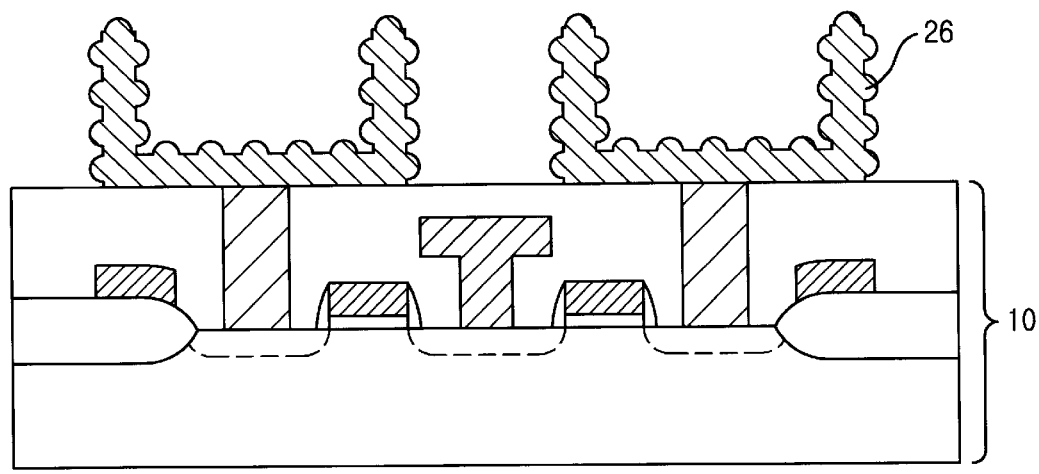

In an ensuing step, the bottom electrode structures 25 are carried out by a seeding and an annealing processes to produce a rugged surface which has relatively large polycrystalline silicon grains of about 50 to about 250 nm, thereby obtaining bottom electrodes 26, as shown in FIG. 2E. The annealing process can include the step of dispersing a material such as polysilicon or silicon dioxide on the surfaces of the bottom electrode structures 25 for producing nucleation sites. And also, the annealing process can include the step of accumulating silicon at the nucleation sites, thereby forming the rugged surface having a rough surface morphology. The resulting surface morphology is usually comprised of relatively large polycrystallites, referred as hemispherical grain (HSG) silicon.

Figure 2F:
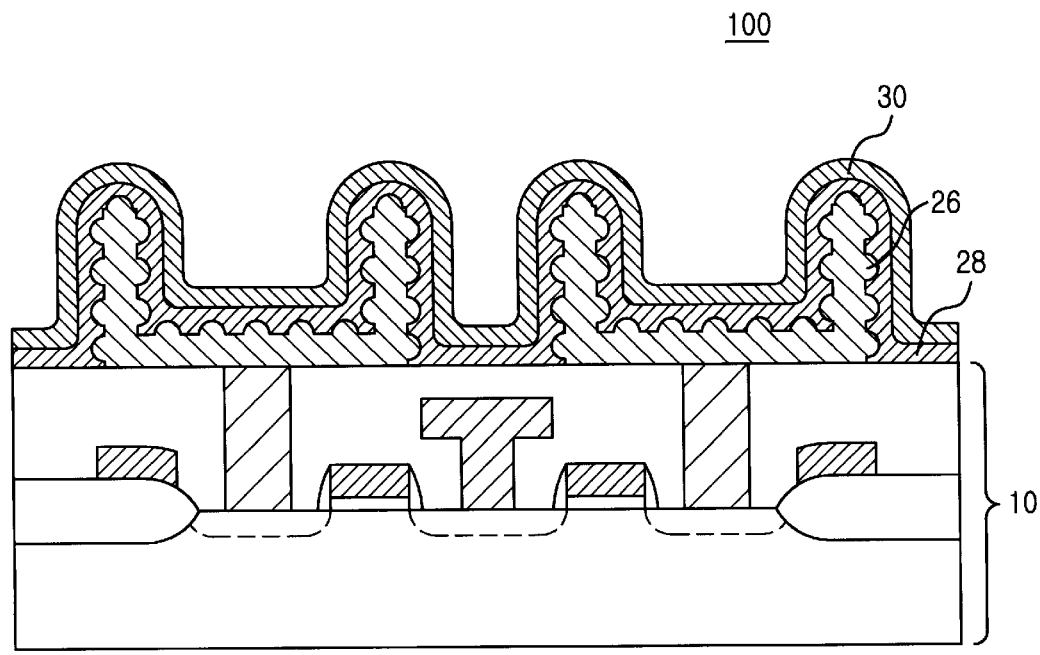

Thereafter, a capacitor dielectric layer 28 and a top electrode layer 30 are formed on top of the bottom electrodes 26, successively, as shown in FIG. 2F.

By utilizing a carbon layer as a supporting layer, the present invention can manufacture a semiconductor memory device without forming an etch stop layer on top of the active matrix.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, the method comprising the steps of:
   a) preparing an active matrix provided with at lest one transistor, a plurality of conductive plugs electrically connected to the transistors and an insulating layer formed around the conductive plugs;
   b) forming a supporting layer, made of carbon, on top of the active matrix and patterned into a predetermined configuration, thereby obtaining a patterned supporting layer;
   c) forming a conductive layer for bottom electrodes on the patterned supporting layer and the active matrix;
   d) forming a photoresist layer on the conductive layer;
   e) planarizing the photoresist layer and the conductive layer until the patterned supporting layer is exposed; and
   f) removing the patterned supporting layer.

2. The method of claim 1, wherein the insulating layer includes boron phosphor silicate glass (BPSG).

3. The method of claim 2, wherein the supporting layer formed by using a chemical vapor deposition (CVD).

4. The method of claim 3, wherein the supporting layer has a thickness ranging from approximately 8,000 Å to 15,000 Å.

5. The method of claim 1, wherein the step f) includes the steps of:
   forming a plasma by using an oxygen gas, thereby obtaining an $O_2$ plasma; and
   reacting the patterned supporting layer with the $O_2$ plasma, thereby removing the patterened supporting layer.

6. The method of claim 1, wherein the conductive layer includes a material selected from a group consisting of amorphous silicon, poly silicon, $Ta_2O_5$ and TiN.

7. The method of claim 6, wherein the step f), further comprising the step of:
   forming hemispherical grains (HSGs) on surfaces of the bottom electrodes.

8. The method of claim 7, wherein the conductive layer has a thickness ranging from approximately 400 Å to 700 Å.

9. The method of claim 7, after the step f), further comprising the steps of:
   forming capacitor dielectric films on top of the bottom electrodes; and
   forming top electrodes on top of the capacitor dielectric films, thereby obtaining a capacitor.

* * * * *

UNITED STATES PATENT AND TRADEMARK OFFICE
CERTIFICATE OF CORRECTION

PATENT NO.     : 6,444,538 B2
DATED          : September 3, 2002
INVENTOR(S)    : Se-Han Kwon and Jang-Yup Kim It is certified that error appears in the above-identified patent and that said Letters Patent is hereby corrected as shown below:

Column 4,
Line 5, "lest" should read -- least --.
Line 34, "patterened" should read -- patterned --.

Signed and Sealed this

Eighth Day of July, 2003

JAMES E. ROGAN
*Director of the United States Patent and Trademark Office*